(12) United States Patent
Hsu

(10) Patent No.: US 10,840,301 B2
(45) Date of Patent: Nov. 17, 2020

(54) 3D VERTICAL MEMORY ARRAY CELL STRUCTURES WITH INDIVIDUAL SELECTORS AND PROCESSES

(71) Applicant: Fu-Chang Hsu, San Jose, CA (US)

(72) Inventor: Fu-Chang Hsu, San Jose, CA (US)

( * ) Notice: Subject to any disclaimer, the term of this patent is extended or adjusted under 35 U.S.C. 154(b) by 0 days.

(21) Appl. No.: 16/687,555

(22) Filed: Nov. 18, 2019

(65) Prior Publication Data

US 2020/0161371 A1 May 21, 2020

Related U.S. Application Data

(63) Continuation of application No. 15/360,895, filed on Nov. 23, 2016, now Pat. No. 10,483,324.

(60) Provisional application No. 62/259,589, filed on Nov. 24, 2015.

(51) Int. Cl.
| | |
|---|---|
| *H01L 27/24* | (2006.01) |
| *H01L 27/11514* | (2017.01) |
| *H01L 27/11597* | (2017.01) |
| *H01L 27/22* | (2006.01) |
| *H01L 43/02* | (2006.01) |
| *H01L 43/08* | (2006.01) |
| *H01L 43/12* | (2006.01) |
| *H01L 45/00* | (2006.01) |

(52) U.S. Cl.
CPC ...... *H01L 27/249* (2013.01); *H01L 27/11514* (2013.01); *H01L 27/11597* (2013.01); *H01L 27/224* (2013.01); *H01L 27/2409* (2013.01); *H01L 27/2427* (2013.01); *H01L 43/02* (2013.01); *H01L 43/08* (2013.01); *H01L 43/12* (2013.01); *H01L 45/06* (2013.01); *H01L 45/08* (2013.01); *H01L 45/1226* (2013.01); *H01L 45/1608* (2013.01)

(58) Field of Classification Search
CPC ............ H01L 27/249; H01L 27/11514; H01L 27/11597
See application file for complete search history.

(56) References Cited

U.S. PATENT DOCUMENTS

| | | |
|---|---|---|
| 2012/0099367 A1 | 4/2012 | Azuma et al. |
| 2012/0313072 A1 | 12/2012 | Baek et al. |
| 2014/0043911 A1 | 2/2014 | Samachisa et al. |
| 2016/0071860 A1 | 3/2016 | Kai et al. |
| 2016/0079530 A1 | 3/2016 | Kim et al. |
| 2016/0111434 A1 | 4/2016 | Pachmatithu |
| 2016/0133866 A1 | 5/2016 | Li et al. |

(Continued)

OTHER PUBLICATIONS

International Search Report, dated Feb. 15, 2017, for corresponding International Application No. PCT/US2016/063683.

(Continued)

*Primary Examiner* — Errol V Fernandes
(74) *Attorney, Agent, or Firm* — Intellectual Property Law Group LLP

(57) ABSTRACT

Three-dimensional vertical memory array cell structures and processes. In an exemplary embodiment, a cell structure includes a word line, a selector layer, and a memory layer. The word line, the selector layer, and the memory layer form a vertical cell structure in which at least one of the selector layer and the memory layer are segmented to form a segment that blocks sneak path leakage current on the word line.

16 Claims, 17 Drawing Sheets

(56) References Cited

U.S. PATENT DOCUMENTS

2017/0125483 A1 5/2017 Tanaka
2017/0141161 A1* 5/2017 Sakotsubo ............ H01L 27/249

OTHER PUBLICATIONS

Written Opinion of the International Searching Authority, dated Feb. 15, 2017, for corresponding International Application No. PCT/US2016/063683.
International Search Report, dated Mar. 5, 2019, for corresponding International Application No. PCT/US2018/065857.
Written Opinion of the International Searching Authority, dated Mar. 5, 2019, for corresponding International Application No. PCT/US2018/065857.

* cited by examiner

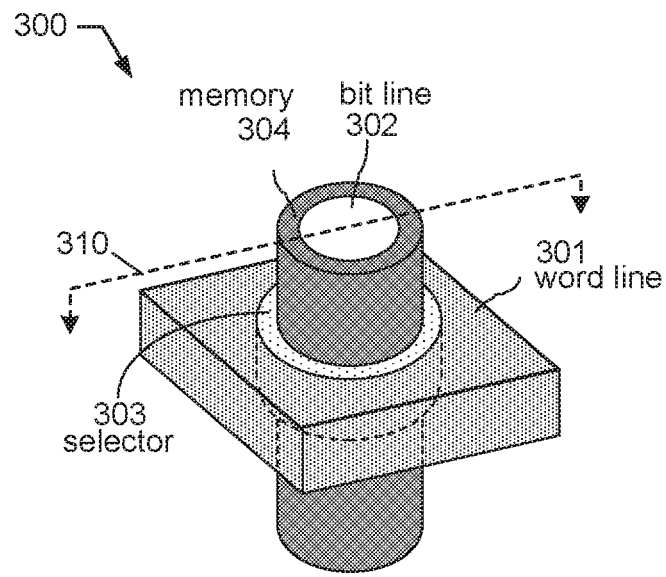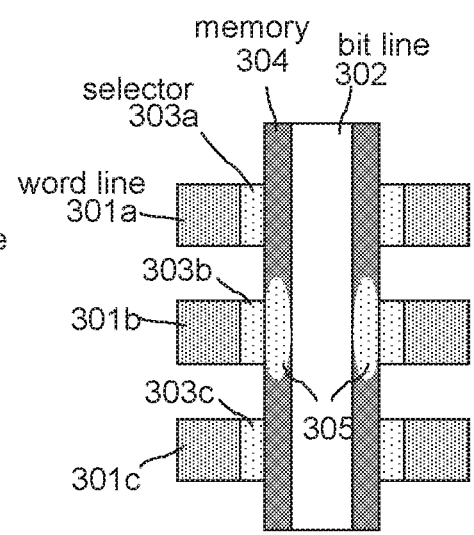
FIG. 3A    FIG. 3B
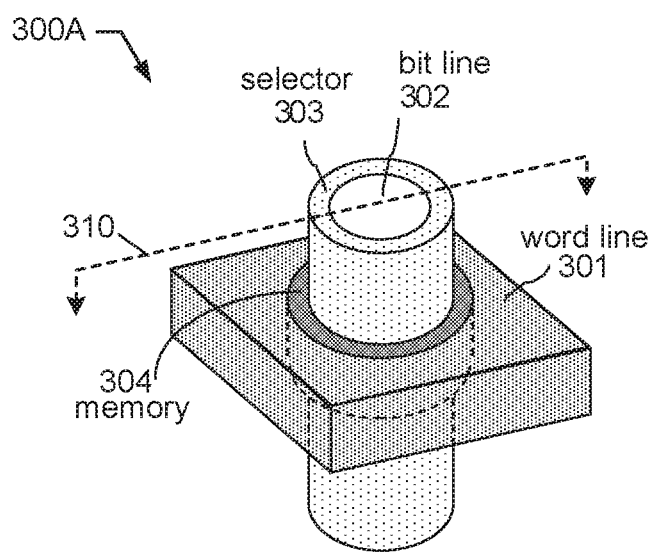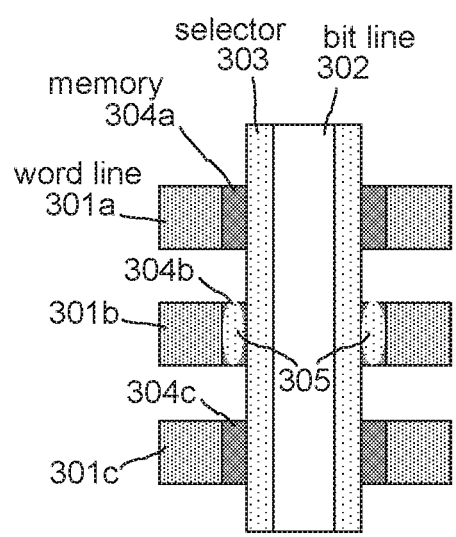
FIG. 3C    FIG. 3D

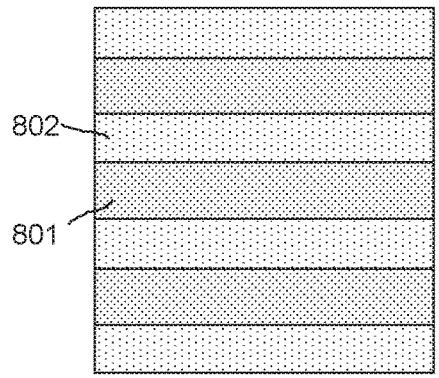
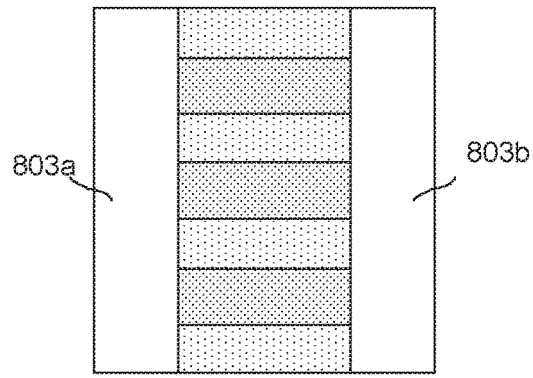
FIG. 8A  FIG. 8B
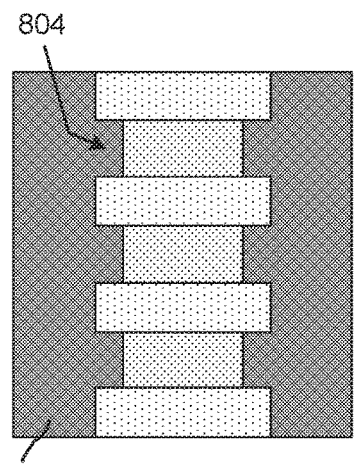
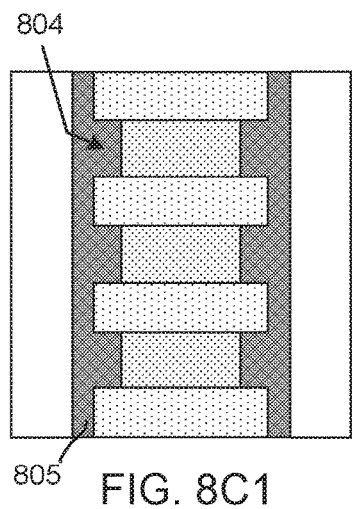
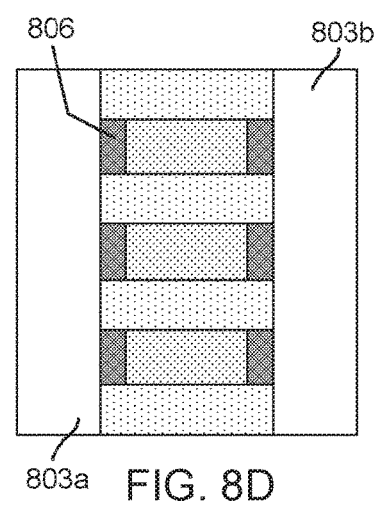
FIG. 8C  FIG. 8C1  FIG. 8D
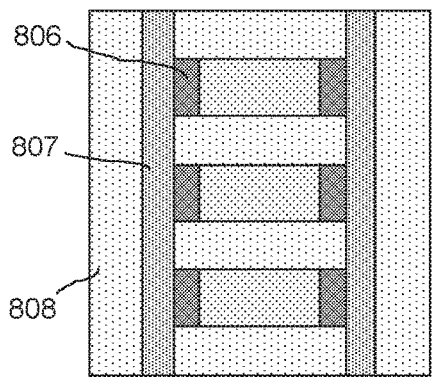
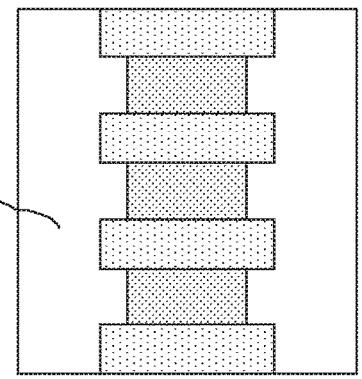
FIG. 8E  FIG. 8F

3D VERTICAL MEMORY ARRAY CELL STRUCTURES WITH INDIVIDUAL SELECTORS AND PROCESSES

CROSS-REFERENCE TO RELATED APPLICATIONS

This Application is a continuation of co-pending U.S. patent application Ser. No. 15/360,895, filed on Nov. 23, 2016, and entitled "3D VERTICAL MEMORY ARRAY CELL STRUCTURES AND PROCESSES." The application Ser. No. 15/360,895 claims the benefit of priority based upon U.S. Provisional Patent Application No. 62/259,589, filed on Nov. 24, 2015, and entitled "3D VERTICAL ARRAY CELL STRUCTURES FOR RRAM, PCM, AND OTHER MEMORIES," which is hereby incorporated herein by reference in its entirety.

FIELD OF THE INVENTION

The exemplary embodiments of the present invention relate generally to the field of semiconductors and integrated circuits, and more specifically to memory and storage devices.

BACKGROUND OF THE INVENTION

In 3D high density memory, a vertical array where the word lines run horizontally and the bit lines run vertically (or vice versa) is preferred over a cross-point array where both word lines and bit lines run horizontally. For example, in a vertical array, the word lines run in a plane that is perpendicular to the plane of the bit lines, while in a cross point array the word lines and bit lines run in the same or parallel planes. A 3D vertical array can be formed by etching through multiple deposited layers together, which can significantly reduce manufacturing cost. In contrast, a 3D cross-point array requires a pattern-etch process performed layer by layer, and thus the manufacturing costs are higher.

One problem associated with implementing a 3D array is referred to as a "sneak leakage path" problem. A sneak leakage path allows current to flow on a word line associated with an off memory cell. Though there are techniques to address this problem in 3D cross point arrays, an effective solution for 3D vertical arrays is desired.

FIG. 1A shows a conventional vertical cell string structure having a horizontal electrode (word line) 101, a vertical electrode (bit line) 102, and a selector 103. The selector 103 is used to control current flow direction on the word lines. A typical selector may be a P-N diode, Schottky diode, or other material with threshold behavior for current flow direction. Also shown is a memory element 104, which may be resistive switching material, phase-change material, and/or others depending on the memory type.

Unfortunately, this conventional vertical cell structure exhibits the 'sneak leakage path' problem. Because this cell's selector layer 103 is connected to adjacent cells and the selector is normally a conductor, current can leak through the selector layer 103 to an unselected cell's word line, which is defined as sneak path leakage.

FIG. 1B shows a cross-sectional view of the conventional vertical cell structure shown in FIG. 1A taken at cross-section line 110. As shown in FIG. 1B, there are three horizontal word lines 101a, 101b, and 101c and one vertical bit line 102. Assuming a selected cell on word line 101b is an off cell, the memory element 105 has very high resistance. Because the selector layer 103 is a conductor, current can leak (as shown at path 109) from the bit line 102 through the selector layer 103 from an adjacent on-cell on word line 101a to the word line 101b of the off-cell, and thus cause read errors. For example, the current path 109 shows how current may flow from the bit linen 102 through the selector 103 to the unselected word line 101b due to the sneak leakage path problem.

FIG. 2A shows another conventional vertical cell structure having a horizontal electrode (word line) 201, a vertical electrode (bit line) 202, a selector 203, and a memory 204. FIG. 2B shows a cross-sectional view of the vertical cell structure shown in FIG. 2A taken at cross-section line 210. Similar to the cell structure shown in FIG. 1B, the sneak leakage path problem can exist in the cell structure shown in FIG. 2B as well. For example, referring to FIG. 2B, the cell structure includes horizontal word lines 201a, 201b, and 201c and one vertical bit line 202. It will be assumed that a cell on word line 201b is an off cell such that memory element 205 has very high resistance. Due to the fact that selector layer 203 is a conductor, the current can leak (as show at path 209) from the bit line 202 through the selector layer 203 from an adjacent on-cell on word line 201a to the word line 201b of the off-cell, and thus cause read errors.

Therefore, it is desirable to have cell structures and process flows to form 3D vertical memory arrays to eliminate or reduce the sneak leakage path problem.

SUMMARY

In various exemplary embodiments, several novel cell structures and process flows suitable to form 3D vertical memory arrays are disclosed. In one embodiment, the cell structures comprise individual selectors for each memory cell to eliminate or reduce the sneak leakage path problem. Exemplary process flows are disclosed to form the novel cell structures.

The exemplary embodiments are suitable for use with 3D vertical memory cells and array structures, such as RRAM (resistive random-access memory), PCM (phase change memory), MRAM (magnetic random-access memory), FRAM (ferroelectric random-access memory), anti-fuse OTP NVM (one-time programmable non-volatile memory), and many others.

In an exemplary embodiment, a vertical cell structure is provided that includes a word line, a selector layer, and a memory layer. The word line, the selector layer, and the memory layer form a vertical cell structure in which at least one of the selector layer and the memory layer are segmented to form a segment that blocks sneak path leakage current on the word line.

In an exemplary embodiment, a method is provided for forming a vertical cell structure and includes forming a layer stack comprising word line layers and insulator layers and forming an opening through the layer stack to expose internal surfaces of the word line layers. The method also comprises depositing a first material on the internal surfaces of the word line layers. The first material is one of selector material and memory material and the operation of depositing forms segments of the first material. Each segment is deposited on a corresponding internal surface of a respective word line layer. The method also includes depositing a second material on the first material. The second material is one of the selector material and the memory material that is not used as the first material. The method also includes depositing bit line material on the second material.

In an exemplary embodiment, a 3D vertical array is provided that includes a plurality of cell structures that block sneak path leakage current. The cell structures are formed by performing the operations of forming a layer stack comprising word line layers and insulator layers, and forming an opening through the layer stack to expose internal surfaces of the word line layers. The cell structures are further formed by performing an operation of depositing a first material on the internal surfaces of the word line layers. The first material is one of selector material and memory material. The depositing forms segments of the first material, and each segment is deposited on a corresponding internal surface of a respective word line layer. The cell structures are further formed by performing the operations of depositing a second material on the first material, where the second material is one of the selector material and the memory material that is not used as the first material, and depositing bit line material on the second material.

Additional features and benefits of the exemplary embodiments of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 8A-F shows exemplary embodiments of process flows to form the vertical cell structure shown in FIG. 3K that eliminate or reduce sneak leakage path problems;

DETAILED DESCRIPTION

Figure 1A:
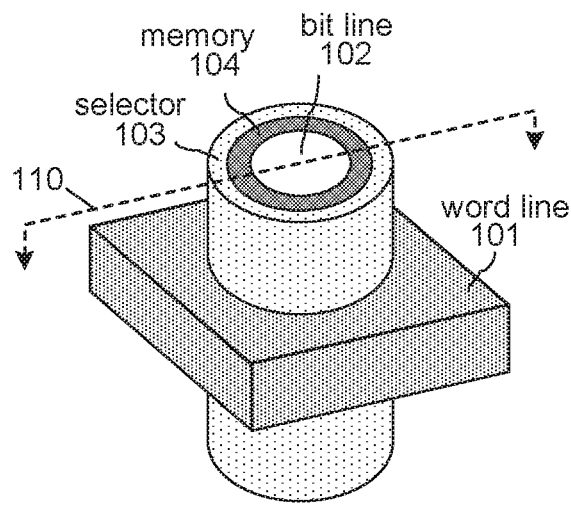
FIGS. 1A-B show a conventional vertical cell structure that experiences the sneak leakage path problem and a corresponding cross-sectional view.

Exemplary embodiments of the present invention are described herein in the context of a process, device, method, and apparatus for providing 3D vertical memory arrays that eliminate or reduce sneak leakage path problems.

Those of ordinary skilled in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators or numbers will be used throughout the drawings and the following detailed description to refer to the same or like parts.

It should be noted that in the following descriptions, novel cell structures are disclosed that are suitable for use to form 3D vertical or horizontal bit line (BL) or word line (WL) arrays depending on the array orientation and/or perspective.

FIGS. 3A-F show exemplary embodiments of cell structures that eliminate or reduce sneak leakage path problems. In an exemplary embodiment, the structures shown in FIGS. 3A-H can be referred to as vertical bit line (BL) arrays and the structures shown in FIGS. 3I-N can be referred to as horizontal BL arrays, or depending on the perspective, a horizontal word line (WL) array.

FIG. 3A shows an exemplary embodiment of a novel vertical cell structure 300. The cell structure 300 comprises a horizontal electrode (word line) 301, a vertical electrode (bit line) 302, and a selector 303. The selector may be a P-N diode, Schottky diode, or any other material with threshold behavior for current flow direction. Also shown is a memory 304 that can be a resistive-switching material for RRAM, phase-change material such as chalcogenide for PCM, Ferromagnetic material for MRAM, ferroelectric material for FRAM, dielectric layer for antifuse OTP NVM, and/or any other material for any type of suitable memory. Both the selector 303 and memory 304 may be single layer or multiple layers. A cross-sectional indicator line 310 is also shown.

FIG. 3B shows a cross-sectional view of the cell structure 300 shown in FIG. 3A. For example, the cross-sectional view is taken at line 310. As illustrated in FIG. 3B, the cell structure 300 includes horizontal word lines 301a, 301b, and 301c having associated selector segments 303a, 303b, and 303c. As can be seen in FIG. 3B, the selector 303 is segmented with each segment associated with a particular word line. It will be assumed that a selected cell associated with word line 301b is an off-cell and that the associated memory element 305 has very high resistance. Because this cell's selector 303b is a segment and is not connected to selector segments of adjacent word lines, there is no sneak leakage path current flowing from the bit line 302 through the selectors of adjacent on-cells to the word line 301b of the off cell 305. Thus, the cell structure shown in FIG. 3A eliminates or reduces sneak leakage path problems.

FIGS. 3C-D show exemplary embodiments of a vertical cell structure 300A and its cross-sectional view. For example, a cross-sectional view of the cell structure 300A taken at line 310 is shown in FIG. 3D. The cell structure in FIG. 3C is similar to the cell structure in FIG. 3A except that the locations of the selector 303 and memory 304 are exchanged (or reversed). However, the configuration in FIG. 3C also prevents sneak path leakage problems since the cell structure's memory 304 is segmented and not connected to adjacent word lines. For example, if the memory 304b is an off-cell, then a region of high resistance 305 is formed that blocks sneak path leakage current from flowing from the bit line 302 through the selector 303 to word line 301b.

Figure 3E:
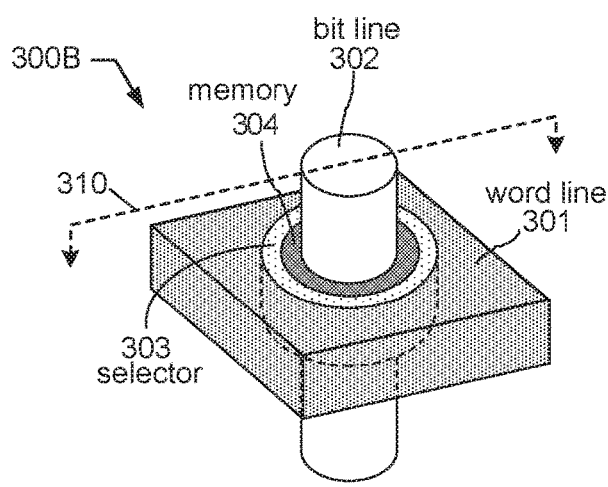
FIGS. 3A-N show exemplary embodiments of vertical cell structures that eliminate or reduce sneak leakage path problems.
Figure 3F:
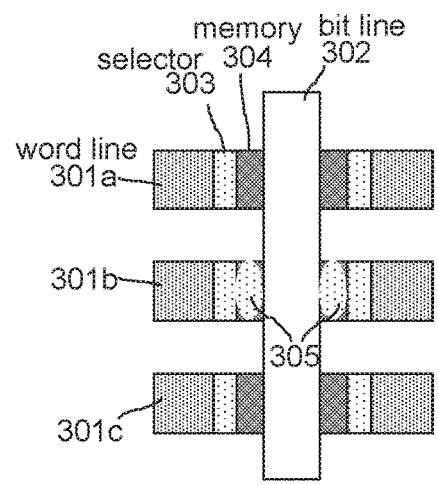

FIGS. 3E-F show exemplary embodiments of a vertical cell structure 300B and its cross-sectional view. For example, a cross-sectional view of the cell structure is taken at line 310 and is shown in FIG. 3F. In this cell structure, both the selector 303 and memory 304 are segmented and therefore separated from adjacent word lines. As a result, sneak path leakage problems are eliminated with this cell structure because there can be no current flow from the bit line 302 through the selector to the word line 301b of the off-cell.

Figure 3G:
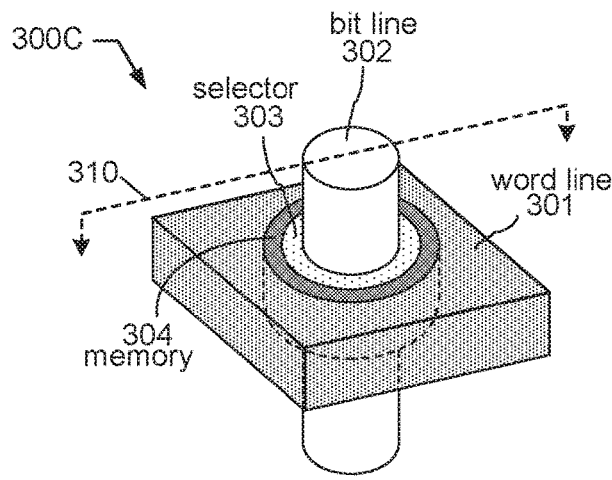
Figure 3H:
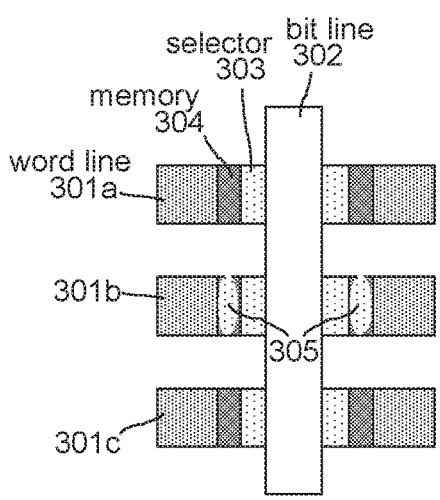

FIGS. 3G-H show exemplary embodiments of a vertical cell structure 300C and its cross-sectional view. For example, a cross-sectional view of the cell structure is taken at line 310 and is shown in FIG. 3H. This cell structure is similar to the one in FIG. 3E except that the locations of the selector 303 and memory 304 are exchanged (or reversed). Thus, both the selector 303 and memory 304 are segmented and therefore separated from adjacent word lines. As a result sneak path leakage problems are eliminated with this cell structure because there can be no current flow from the bit line 302 through the selector 303 to the word line 301b of the off-cell.

Figure 3I:
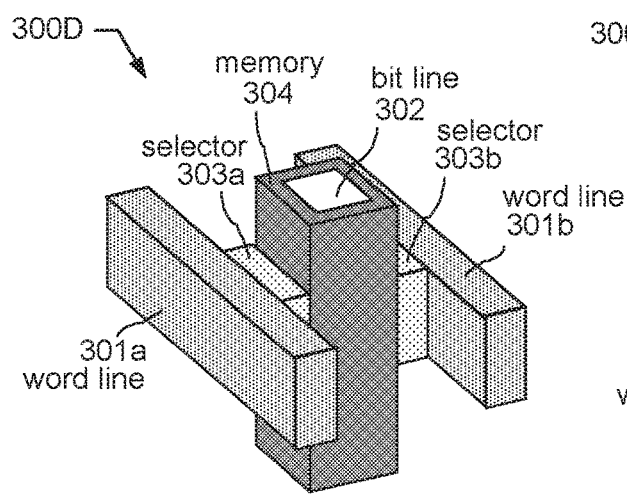

FIG. 3I shows an exemplary embodiment of a vertical cell structure 300D. This cell structure is similar to the cell structure shown in FIG. 3A except that the word line is separated into two portions (e.g., 301a and 301b) that connect to two sides of the bit line 302 to form two cells. Selectors 303a and 303b and memory layer 304 also are shown. As a result, sneak path leakage problems are eliminated with this cell structure because there can be no current flow from the bit line 302 through the segmented selectors 303a and 303b to the word lines 301a and 301b of the off-cells.

Figure 3J:
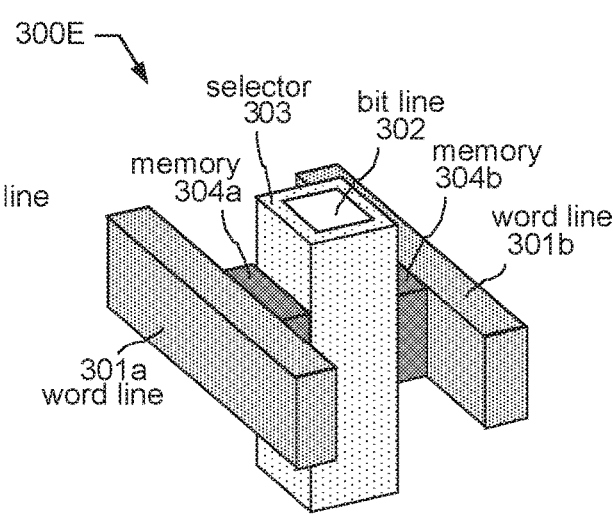

FIG. 3J shows an exemplary embodiment of a vertical cell structure 300E. This cell structure is similar to the one in FIG. 3I except the locations of the selector 303 and memory 304 are exchanged (or reversed). As a result, sneak path leakage problems are eliminated with this cell structure because there can be no current flow from the bit line 302 through the segmented memory 304a and 304b to the word lines 301a and 301b of the off-cells.

Figure 3K:
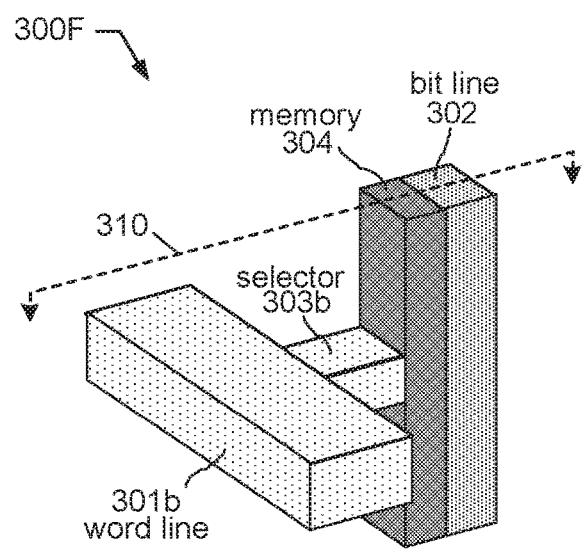
Figure 3L:
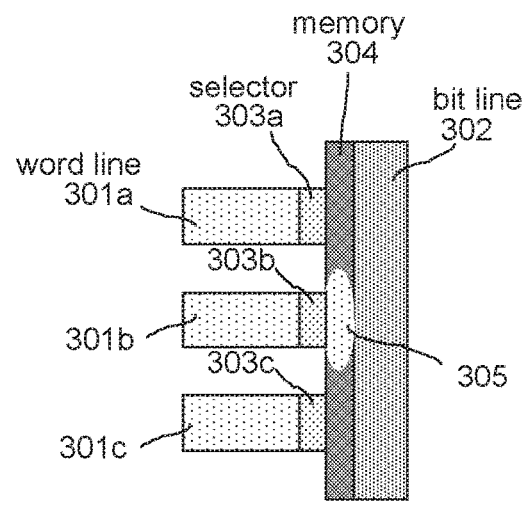

FIGS. 3K-L show exemplary embodiments of a vertical cell structure 300F and its cross-sectional view. For example, a cross-sectional view of the cell structure is taken at line 310 and shown in FIG. 3L. Also, note that for clarity, word lines 301a and 301c are added in FIG. 3L but are not shown in FIG. 3K. Similar to other cell structures above, sneak path leakage problems are eliminated with this cell structure because there can be no current flow from the bit line 302 through the segmented selector 303b to the word line 301b of the off-cell.

Figure 3M:
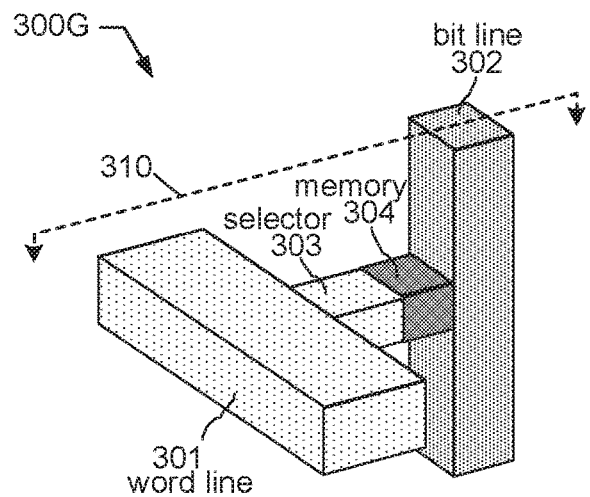
Figure 3N:
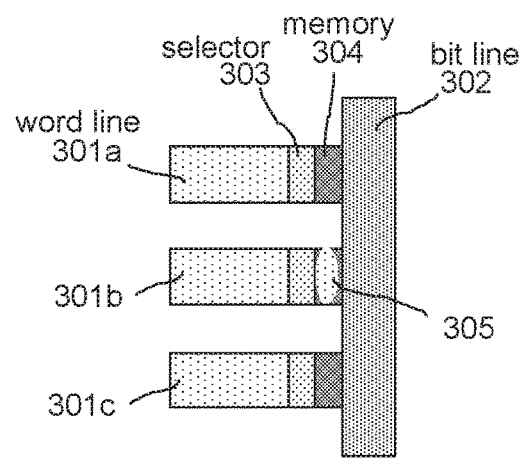

FIG. 3M-N show exemplary embodiments of a vertical cell structure 300G and its cross-sectional view. This cell is similar to the one in FIG. 3K except the memory 304 is segmented and therefore not connected to adjacent cells. FIG. 3N shows the cross-section view of the cell structure in FIG. 3M taken at line 310. Similar to the cell shown in FIG. 3K, the segmented selector and/or memory of the cell structure 300G prevents sneak leakage path problems. It should also be noted that in another embodiment the select 303 and memory 304 may be exchanged (or reversed) for the cell structures shown in FIG. 3K and FIG. 3M and sneak leakage path problems would still be prevented.

Several exemplary novel process flows and/or steps to manufacture the above novel vertical cell structures are disclosed below.

Figure 1B:
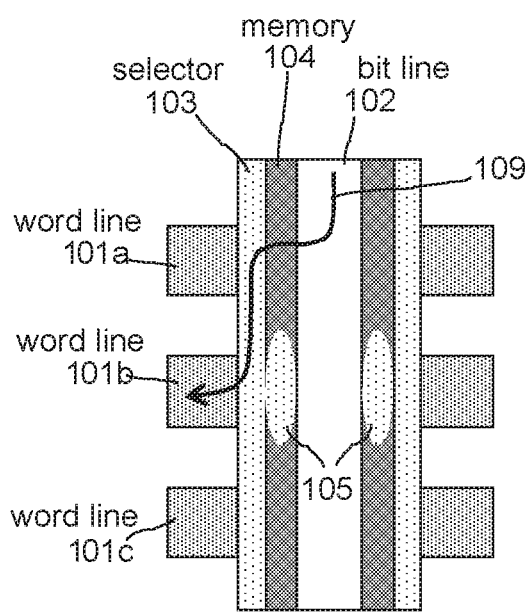
Figure 2A:
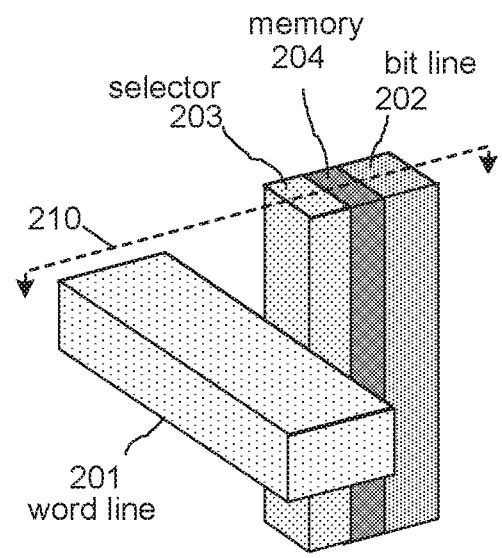
FIGS. 2A-B show another conventional vertical cell structure that experiences the sneak leakage path problem and a corresponding cross-sectional view.
Figure 2B:
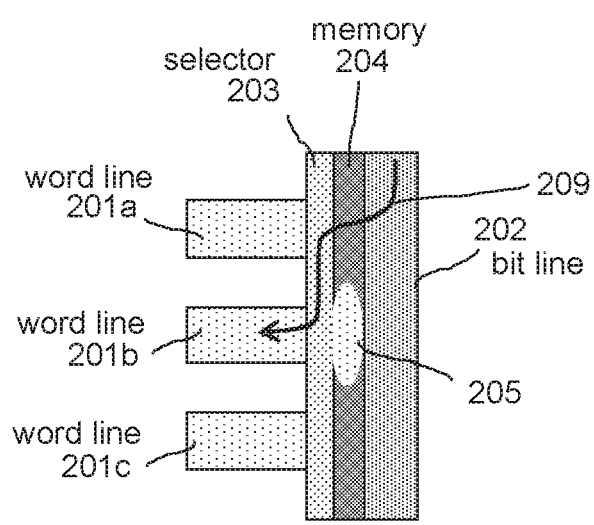
Figure 4A:
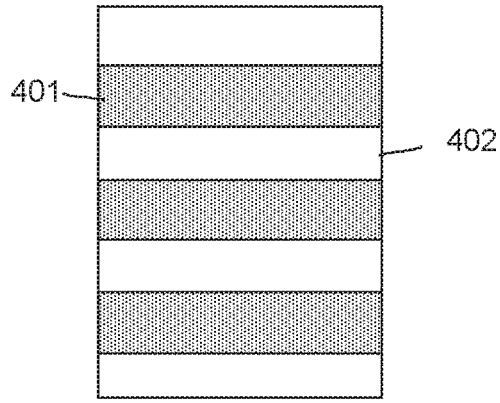
FIGS. 4A-F show exemplary embodiments of process flows according to the invention to form the vertical cell structure shown in FIG. 3A that eliminate or reduce sneak leakage path problems.
Figure 4B:
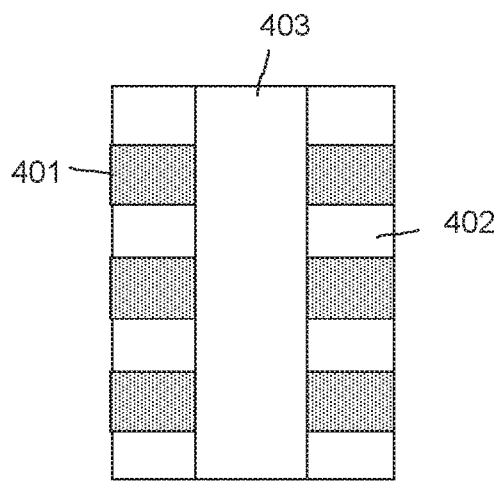
Figure 4C:
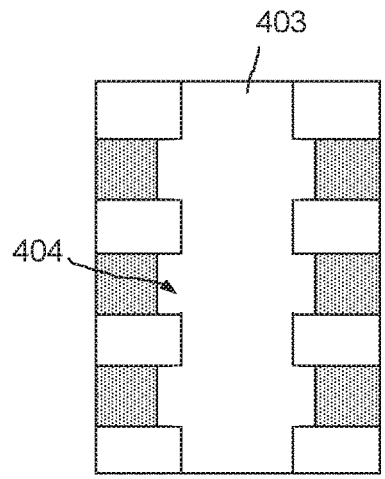
Figure 4D:
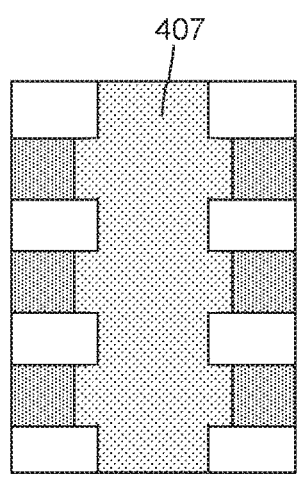

FIGS. 4A-F show exemplary embodiments of process flows according to the invention to form the vertical cell structure shown in FIG. 3A. FIG. 4A shows a first process step (or operation) wherein multiple conductor layers for word lines 401 and insulator layers 402 are deposited. FIG. 4B shows a second process step wherein bit line holes (or openings) 403 are pattern-etched through all the word line layers. FIG. 4C shows a third process step wherein word line material is selectively etched to form the spaces or regions 404 on the sidewall. FIG. 4D shows a fourth process step wherein the bit line holes 403 and regions 404 are filled with a selector material 407. FIG. 4D1 shows another exemplary embodiment in which the selector material 407 is formed as a layer on the sidewall of the bit line hole.

Figure 4E:
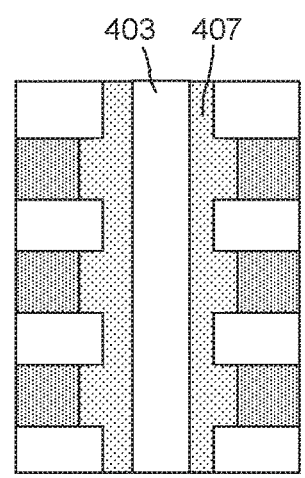
Figure 4E:
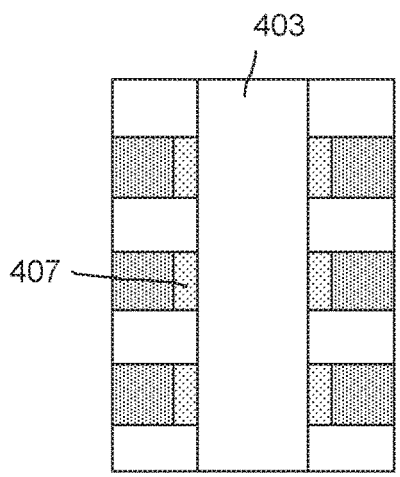
Figure 4F:
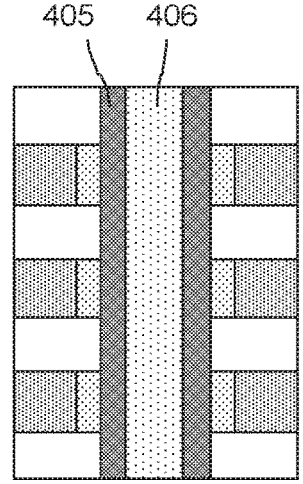

FIG. 4E shows a fifth process step wherein the selector material in the bit line holes is etched and the selector material 407 only partially remains in the sidewall region 404. FIG. 4F shows a sixth process step wherein a memory layer 405 is formed on the sidewall of the bit line holes, and then the bit line holes are filled with conductor 406 to form a bit line. As a result, the vertical cell structure shown in FIG. 3A is formed. Similarly, the vertical cell structure shown in FIG. 3C may be formed by using the same process flow with the selector layer 407 and memory layer 405 exchanged.

Figure 5A:
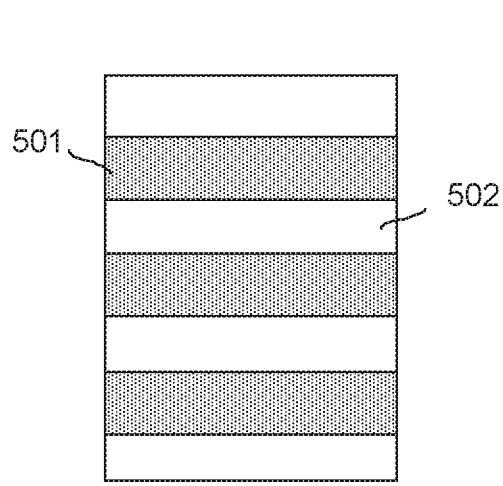
FIGS. 5A-H show exemplary embodiments of process flows to form the vertical cell structure shown in FIG. 3C that eliminate or reduce sneak leakage path problems.
Figure 5B:
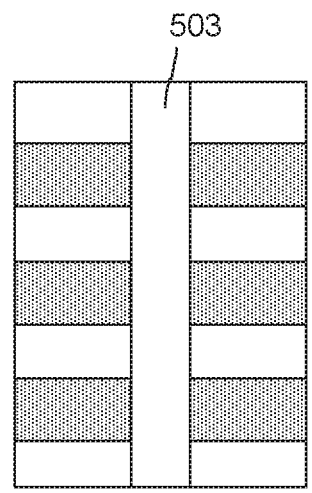
Figure 5C:
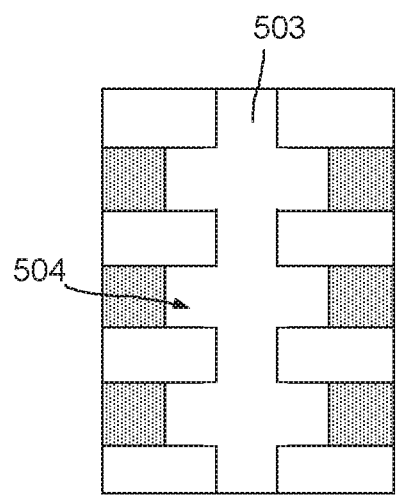
Figure 5D:
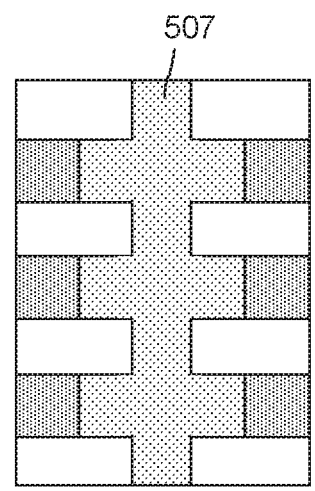

FIGS. 5A-H show exemplary embodiments of a process flow according to the invention to form the vertical cell structure in FIG. 3E. FIG. 5A shows a first process step (or operation) wherein multiple conductor layers for word lines 501 and insulator layers 502 are deposited. FIG. 5B shows a second process step wherein a bit line hole (or opening) 503 is pattern-etched through all the word line layers. FIG. 5C shows a third process step wherein the word line material is selectively etched to form the space (or regions) 504 on the sidewall. FIG. 5D shows a fourth process step wherein the bit line hole 503 and regions 504 are filled with the selector material 507. In another exemplary embodiment, the selector material 507 is formed as a layer on the sidewall of the bit line hole 503.

Figure 5E:
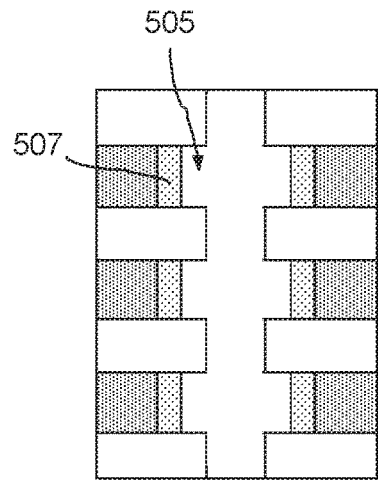
Figure 5F:
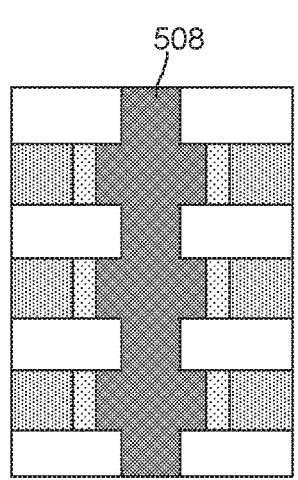

FIG. 5E shows a fifth process step wherein the selector material 507 in the bit line hole is selectively etched to partly remain in the region 504 and form a space (or region) 505 on the sidewall. FIG. 5F shows a sixth process step wherein the bit line hole 503 and regions 505 are filled with the memory layer material 508. In another exemplary embodiment, shown in FIG. 5F1, the memory material 508 is formed as a layer on the sidewall of the bit line hole 503.

Figure 5G:
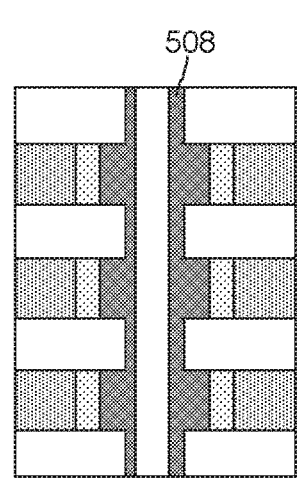
Figure 5G:
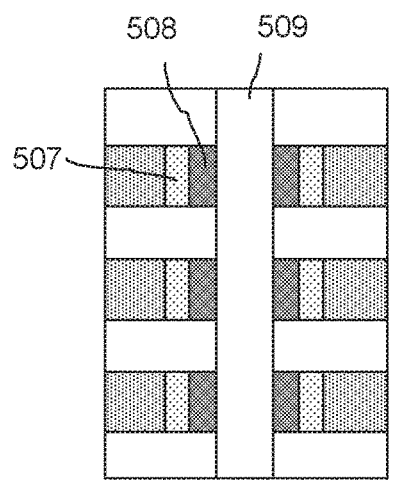
Figure 5H:
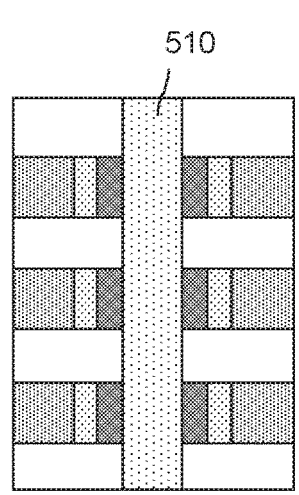

FIG. 5G shows a seventh process step wherein the memory layer material 508 in the bit line hole is selectively etched forming a hole or opening 509 and leaving a portion of memory layer material 508 on the sidewall that fills the opening 505. FIG. 5H shows an eighth process step wherein the bit line hole 509 is filled with conductor 510 to form the bit line. As a result, the cell structure shown in FIG. 3E is formed. Similarly, the cell structure embodiment shown in FIG. 3G may be formed by using the same process flow with the selector layer 507 and memory layer 508 exchanged.

Figure 6A:
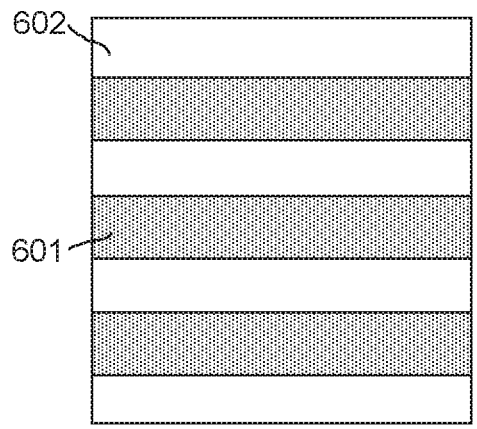
FIGS. 6A-G show exemplary embodiments of process flows to form the vertical cell structure shown in FIG. 3A that eliminate or reduce sneak leakage path problems.
Figure 6B:
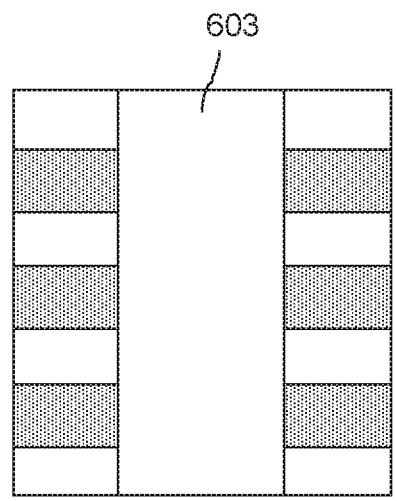
Figure 6C:
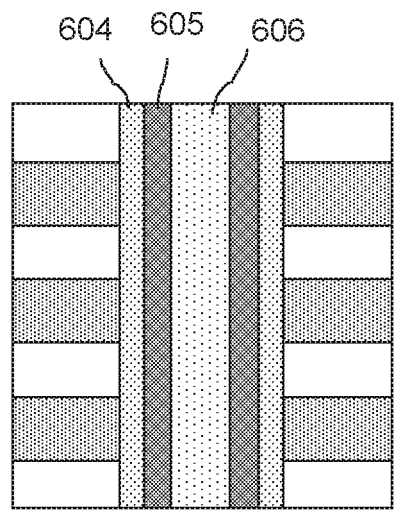
Figure 6D:
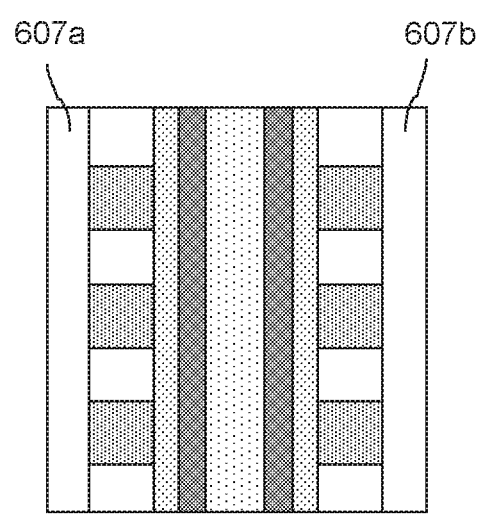
Figure 6E:
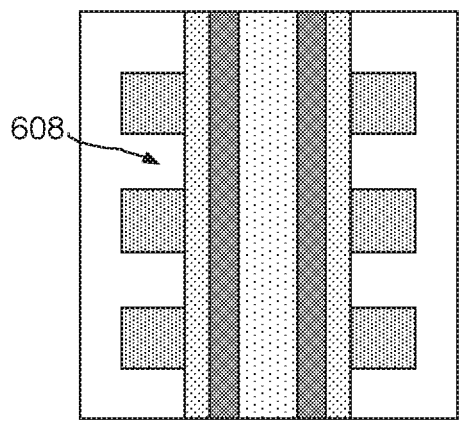
Figure 6F:
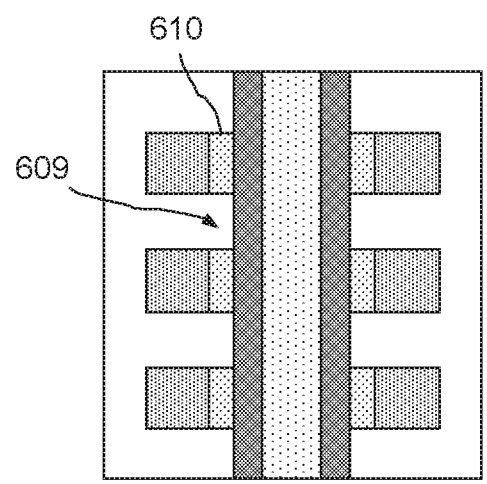
Figure 6G:
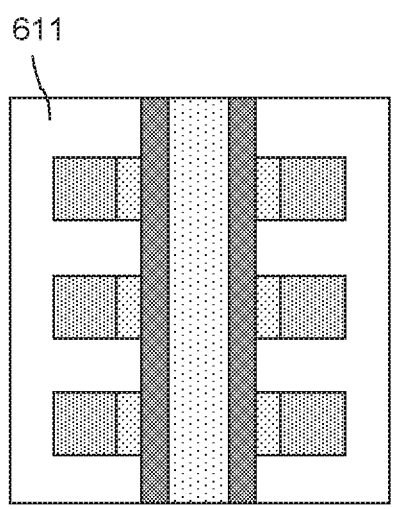

FIGS. 6A-G show exemplary embodiments of process flows to form the cell structure shown in FIG. 3A that eliminates sneak leakage path problems. This flow is suitable for use with a 3D array having word line slits. FIG. 6A shows a first process step (or operation) wherein multiple conductor layers for word lines 601 and insulator layers 602 are deposited. FIG. 6B shows a second process step wherein a bit line hole 603 is pattern-etched through all the word line layers. FIG. 6C shows a third process step wherein a selector layer 604 and memory layer 605 are formed on the sidewall of the bit line hole 603. The remaining portion of the bit line hole 603 is filled with conductor 606. FIG. 6D shows a fourth process step wherein word line slits 607a and 607b are pattern-etched through all the word line layers. FIG. 6E shows a fifth process step wherein the insulator layers between the word line layers in the area or region 608 are selectively etched away through the word line slits. FIG. 6F shows a sixth process step wherein the selector layer 604 in the area or region 609 between the word lines is selectively etched away through the word line slits to form the separated selectors 610 for each cell (e.g., word line). FIG. 6G shows a seventh process step wherein the word line slits and the space between the word line layers are filled with insulator 611. As a result, the cell structure shown in FIG. 3A is formed.

Figure 6H:
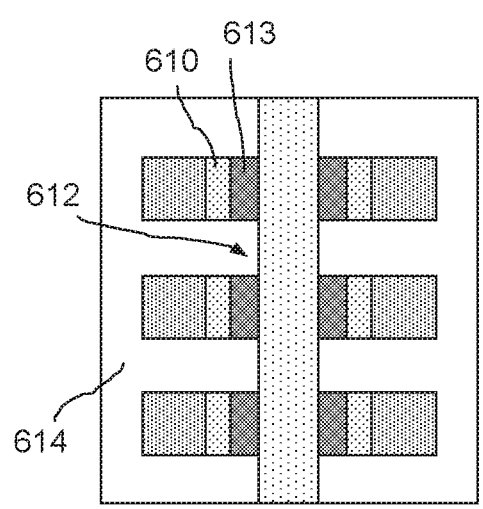
FIG. 6H shows an exemplary embodiment of process flows to form the vertical cell structure shown in FIG. 3E that eliminate or reduce sneak leakage path problems.

FIG. 6H shows an exemplary embodiment of process flows to form the cell structure shown in FIG. 3E that eliminates sneak leakage path problems. After the process operations of FIG. 6F are performed, the memory layer in the area 612 is selectively etched away through the word line slits to form separate memory element 613 for each cell. Then, the word line slits and the space between the word line layers are filled with insulator 614. As a result, the cell structure shown in FIG. 3E is formed. Similarly, the cell embodiments of FIG. 3C can be formed using the same process flow used to form the cell structure shown in FIG. 3A, and the cell embodiment shown in FIG. 3G can be formed using the same process flow used to form the cell structure shown in FIG. 3E by simply exchanging the selector layer 610 and memory layer 613.

Figure 7A:
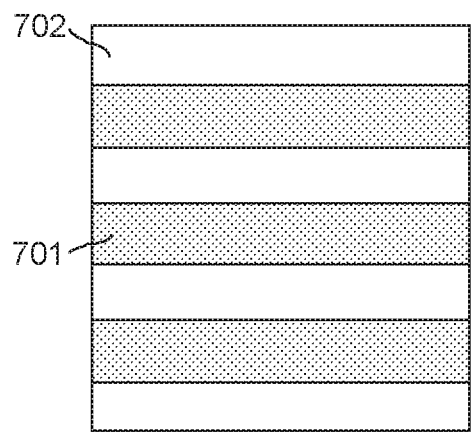
FIGS. 7A-H show exemplary embodiments of process flows suitable for use with a 3D array having word line slits to form the vertical cell structures that eliminate or reduce sneak leakage path problems.
Figure 7B:
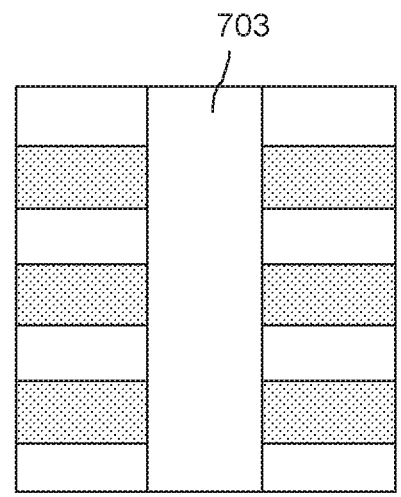
Figure 7C:
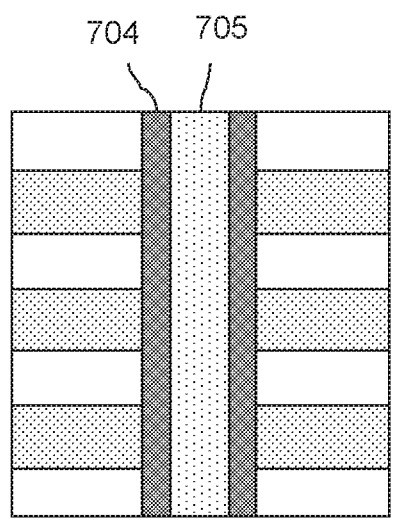
Figure 7D:
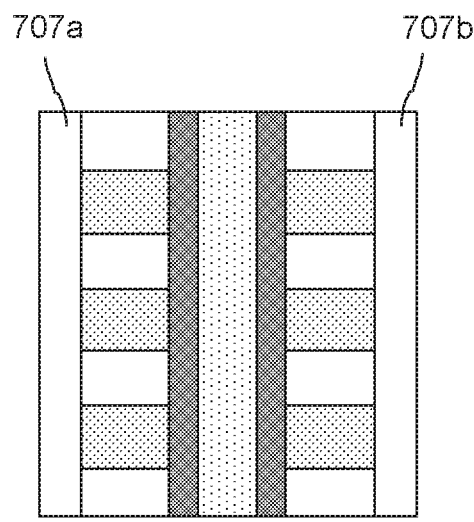

FIGS. 7A-H show exemplary embodiments of process flows suitable for use with a 3D array having word line slits to form vertical cell structures that eliminates sneak leakage path problems. FIG. 7A shows a first process step (or operation) wherein multiple selector layers 701 and insulator layers 702 are deposited. FIG. 7B shows a second process step wherein a bit line hole (or opening) 703 is pattern-etched through all the selector layers 701 and insulator layers 702. FIG. 7C shows a third process step wherein a memory layer 704 is formed on the sidewall of the bit line hole. Then, the remaining portion of the bit line hole is filled with conductor 705. FIG. 7D shows a fourth process step wherein slits 707a and 707b are pattern-etched through all the selector layers.

Figure 7E:
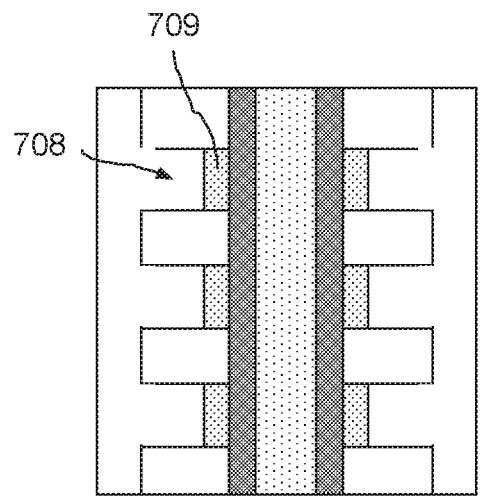
Figure 7F:
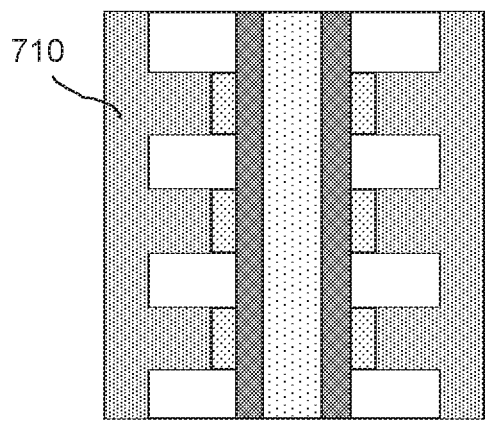
Figure 7G:
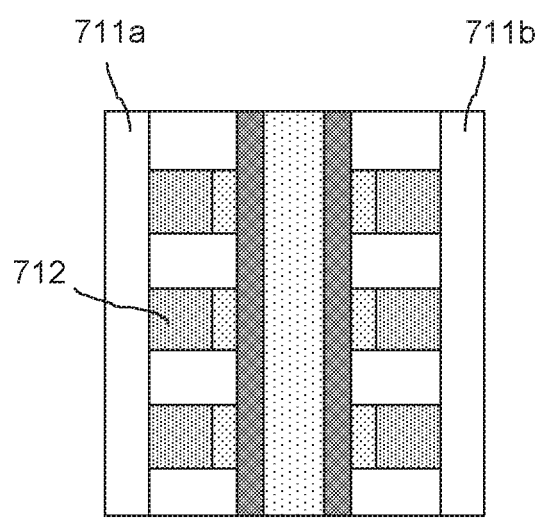
Figure 7H:
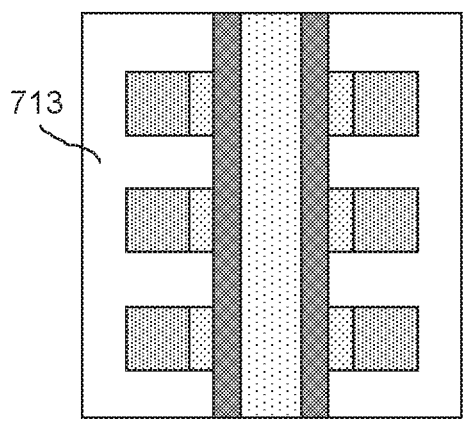

FIG. 7E shows a fifth process step wherein the selector layers in the area 708 are selectively etched through the slits to form a separated selector 709 for each cell. FIG. 7F shows a sixth process step wherein the slits and the space between the insulator layers are filled with conductor 710. FIG. 7G shows a seventh process step wherein the conductor material 710 located in slits 711a and 711b are etched away to form the word line pattern 712. FIG. 7H shows an eighth process step wherein the slits are filled with insulator 713. As a result, the cell structure shown in FIG. 3A is formed. Similarly, the cell structure embodiment of FIG. 3E may be formed by using a similar process flow but skipping the process shown in FIG. 7C and repeating the process shown in FIG. 7E for the memory layer.

Please notice, the cell embodiments shown in FIG. 3I-J may be formed by the same process flows previously described, except an extra etching step may be applied before the bit line hole etching to separate the word lines. After which, the word line slits are filled with insulator, and then the bit line holes are etched.

FIGS. 8A-F shows exemplary embodiments of process flows to form the vertical cell structure shown in FIG. 3K that eliminates sneak leakage path problems. FIG. 8A shows a first process step (or operation) wherein multiple conductor layers for word lines 801 and insulator layers 802 are deposited. FIG. 8B shows a second process step wherein word line slits 803a and 803b are etched though all word line layers to form the word line pattern. FIG. 8C shows a third process operation wherein the word line material is selectively etched to form the space 804 on the sidewall of the slits. Then, the slits are filled with a selector material 805. In another exemplary embodiment, shown in FIG. 8C1, the selector material 805 is formed on the sidewall of the slits. FIG. 8D shows a fourth process step wherein the selector material in slits 803a and 803b are etched to form the separated selectors 806 for each cell. FIG. 8E shows a fifth process step wherein a memory layer 807 is formed on the sidewall of the word line slits. Then, the word line slits are filled with conductor 808. After that, the bit line pattern is defined and self-align-etched to etch away the unwanted area's conductor 808, memory layer 807, and selector layer 806. FIG. 8F shows a sixth process step wherein the unwanted area after the bit line pattern etching is filled with insulator 809. As a result, the cell structure shown in FIG. 3K is formed. Similarly, another cell embodiment may be formed by using the same process flow with the selector and memory layers exchanged.

Figure 8G:
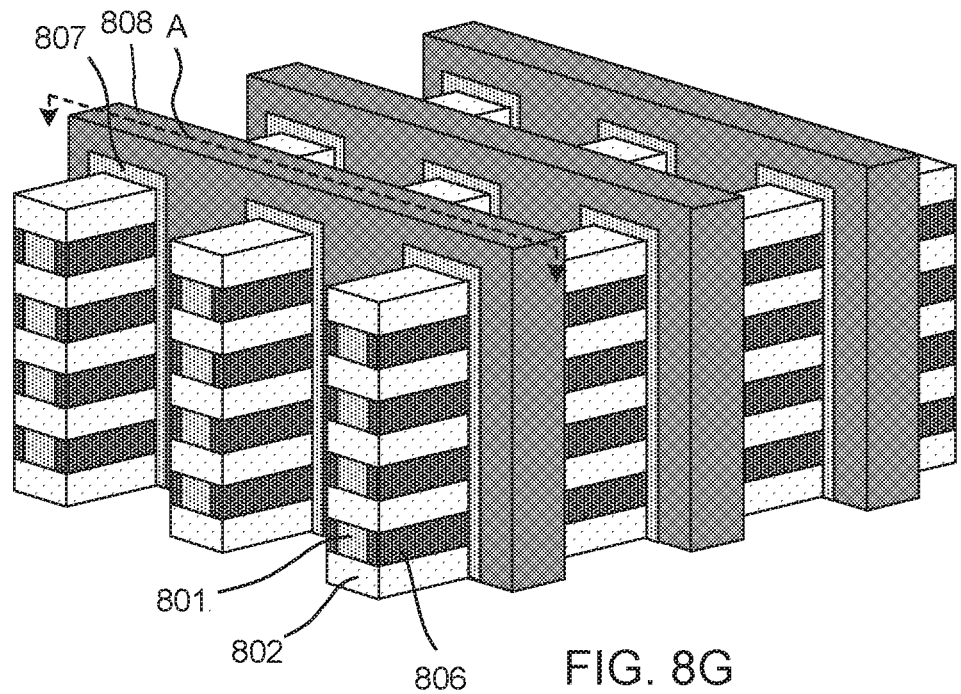
FIGS. 8G-H shows exemplary embodiments of 3D vertical arrays formed by the vertical cell structures shown in FIGS. 8A-F that eliminate or reduce sneak leakage path problems.
Figure 8H:
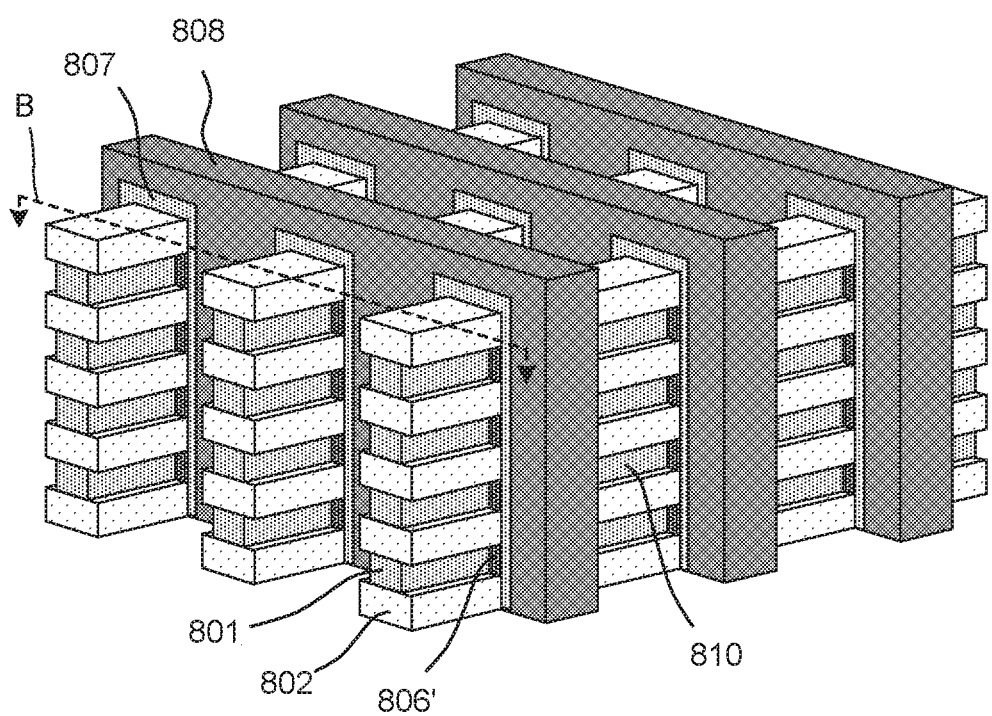

FIGS. 8G-H shows exemplary embodiments of 3D arrays formed using the vertical cell structures shown in FIGS. 8A-F. For example, the 3D arrays can be 3D horizontal bit line arrays or 3D horizontal word line arrays depending on the array orientation. For example, FIG. 8G shows a 3D horizontal bit line array before removal of the selector sidewall as illustrated in FIG. 8E. FIG. 8H shows the 3D horizontal bit line array after removal of the selector sidewall as illustrated in FIG. 8F. Thus, FIG. 8E shows the cross-section view along line A of the array shown in FIG. 8G, and FIG. 8F shows the cross-section view along line B of the array shown in FIG. 8H.

Figure 9A:
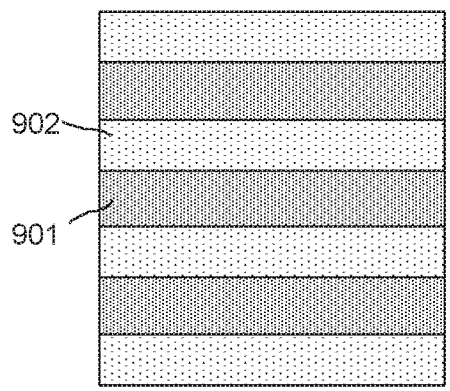
FIGS. 9A-H show exemplary embodiments of process flows to form the vertical cell structure shown in FIG. 3M that eliminate or reduce sneak leakage path problems.
Figure 9B:
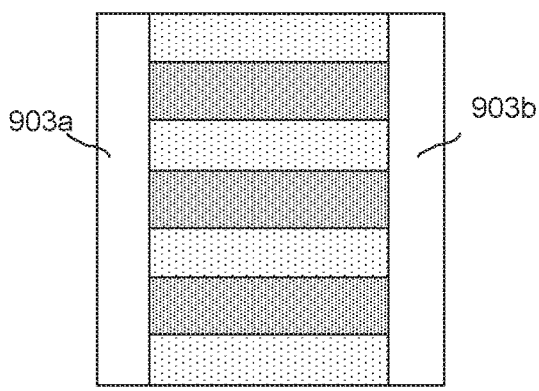
Figure 9C:
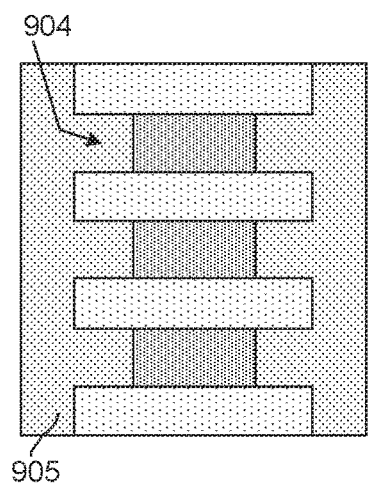
Figure 9D:
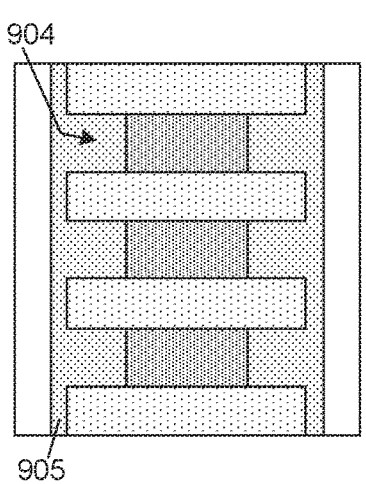
Figure 9D:
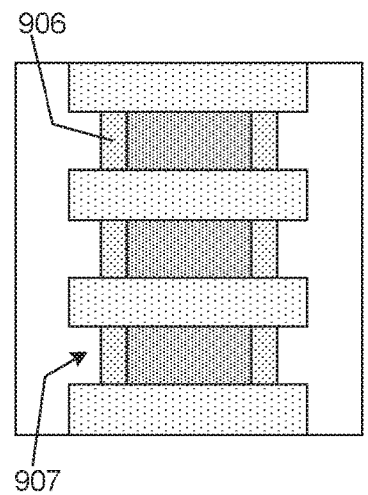

In FIG. 8G, the word line pattern 808 and the memory layer 807 are defined and etched. The selector layers, such as 806, remained in the sidewall of the bit lines 801. In FIG. 8H, the selector layer 806 in the area such as 810 that is not covered by the word line pattern 808 is etched. Therefore, only the selector layer (e.g., 806') that is covered by the word line pattern 808 remains. As a result, a discrete selector is formed for each cell in the intersection of a word line and a bit line FIGS. 9A-H show exemplary embodiments of process flows to form the cell structure shown in FIG. 3M that eliminates sneak leakage path problems. FIG. 9A shows a first process step (or operation) wherein multiple conductor layers for word lines 901 and insulator layers 902 are deposited. FIG. 9B shows a second process step wherein word line slits 903a and 903b are etched though all word line layers to form the word line pattern. FIG. 9C shows a third process step wherein the word line material is selectively etched to form the space 904 on the sidewall of the slits. Then, the slits are filled with a selector material 905. In another exemplary embodiment, shown in FIG. 9C1, the selector material 905 is formed on the sidewall of the slits. FIG. 9D shows a fourth process step wherein the selector material is selectively etched to form the separated selectors 906 for each cell and the space 907 on the sidewall of the slits.

Figure 9E:
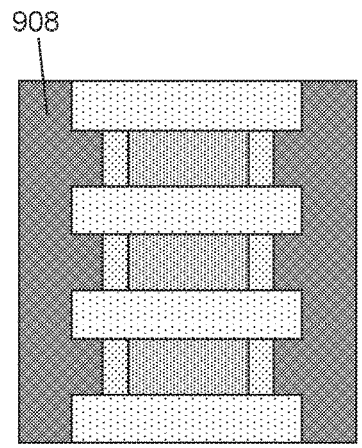
Figure 9F:
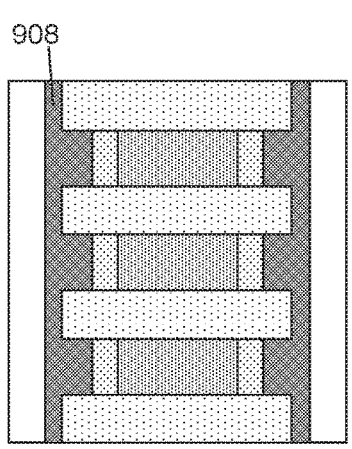
Figure 9F:
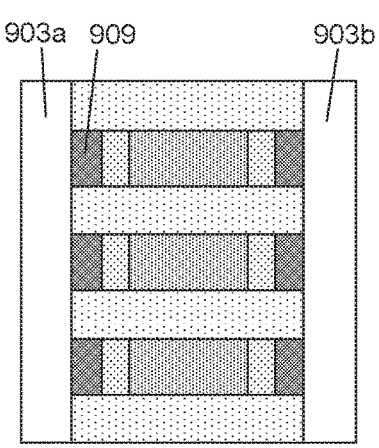
Figure 9G:
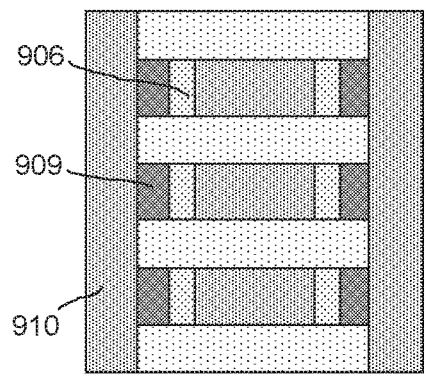
Figure 9H:
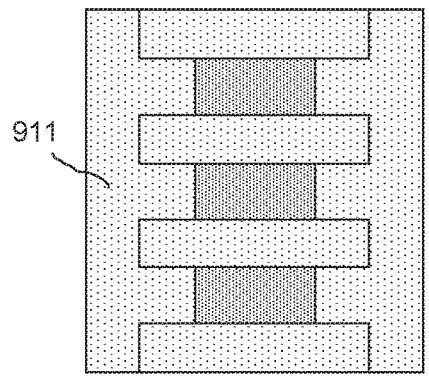

FIG. 9E shows a fifth process step wherein the slits are filled with a memory layer material 908. In another exemplary embodiment, shown in FIG. 9E1, the selector material 908 is formed on the sidewall of the slits. FIG. 9F shows a sixth process step wherein the memory layer in the slits 903*a* and 903*b* is etched to form the separated memory layer 909 for each cell. FIG. 9G shows a seventh process step wherein the slits are filled with conductor 910. After that, the bit line pattern is defined and self-align-etched to etch away the unwanted area's conductor 910, memory layer 909, and selector layer 906. FIG. 9H shows an eighth process step wherein the unwanted area after the bit line pattern etching is filled with insulator 911. As a result, the cell structure shown in FIG. 3M is formed. Similarly, another cell embodiment may be formed by using the same process flow with the selector and memory layers exchanged.

Figure 10:
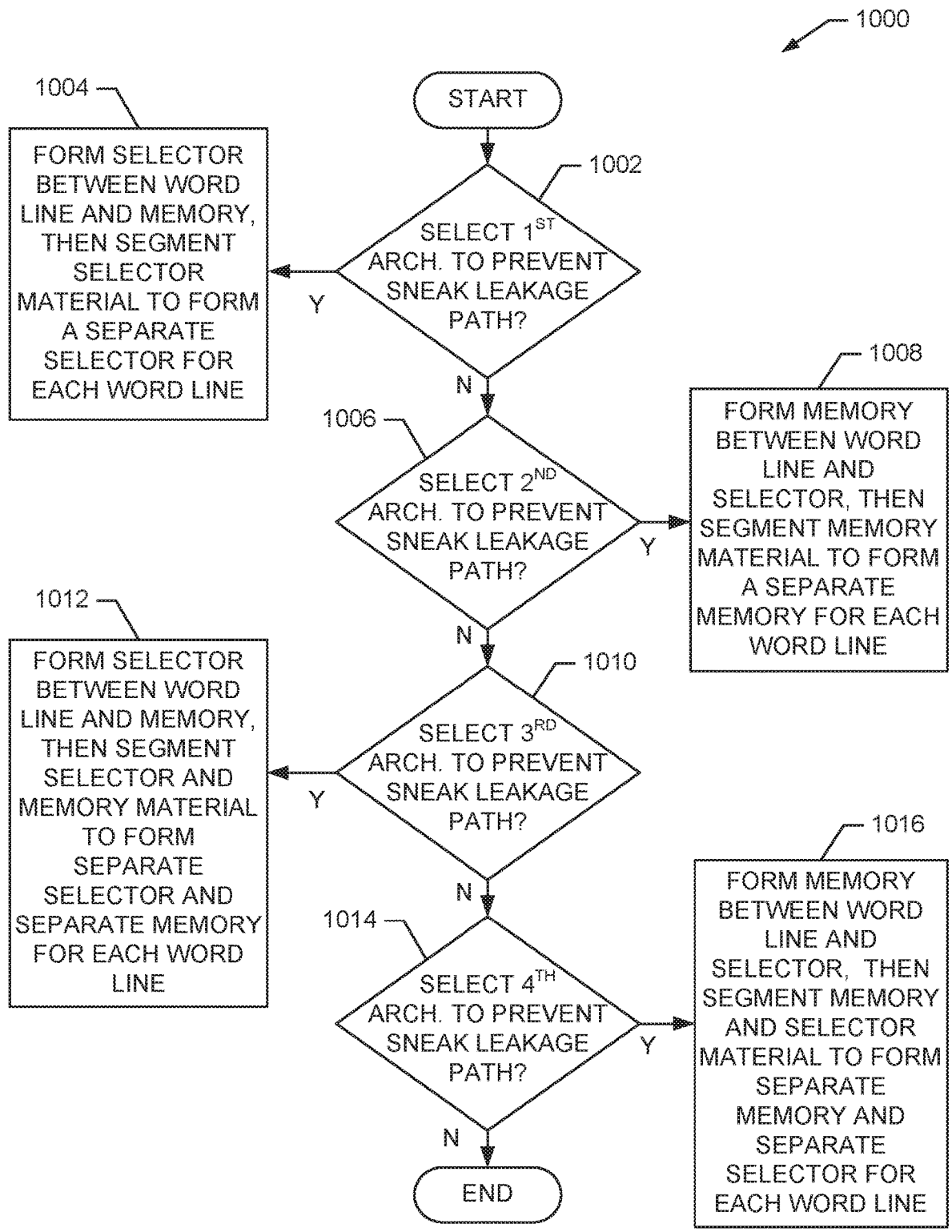
FIG. 10 shows an exemplary embodiment of method for forming a novel cell structure that eliminates or reduces sneak leakage path problems for use in a vertical 3D array.

FIG. 10 shows an exemplary embodiment of method 1000 to form a novel cell structure that eliminates or reduces sneak leakage path problems for use in a vertical 3D array. In an exemplary embodiment, the method 1000 is suitable for use to form the novel cell structures described above.

At block 1002, a determination is made as to whether a first architecture for the vertical cell structure will be used to form the vertical array to prevent sneak leakage path problems. If the first architecture is to be used, then the method proceeds to block 1004. If the first architecture will not be used, then the method proceeds to block 1006.

At block 1004, the 3D vertical array is formed using a vertical cell structure based on the first architecture wherein a selector is formed between the word lines and the memory. The selector is then segmented to form a separate selector segment for each word line. For example, the first architecture results in a vertical cell structure as shown in FIG. 3B.

At block 1006, a determination is made as to whether a second architecture for the cell structure will be used to form the vertical array to prevent sneak leakage path problems. If the second architecture is to be used, then the method proceeds to block 1008. If the second architecture will not be used, then the method proceeds to block 1010.

At block 1008, the 3D vertical array is formed using a vertical cell structure based on the second architecture wherein a memory is formed between the word lines and the selector. The memory is then segmented to form a separate memory segment for each word line. For example, the second architecture results in a cell structure as shown in FIG. 3D.

At block 1010, a determination is made as to whether a third architecture for the cell structure will be used to form the vertical array to prevent sneak leakage path problems. If the third architecture is to be used, then the method proceeds to block 1012. If the third architecture will not be used, then the method proceeds to block 1014.

At block 1012, the 3D vertical array is formed using cell structure based on the third architecture wherein a selector is formed between the word lines and the memory. The selector and the memory are then segmented to from a separate selector segment and a separate memory segment for each word line. For example, the third architecture results in a cell structure as shown in FIG. 3F.

At block 1014, a determination is made as to whether a fourth architecture for the cell structure will be used to form the vertical array to prevent sneak leakage path problems. If the fourth architecture is to be used, then the method proceeds to block 1016. If the fourth architecture will not be used, then the method ends.

At block 1016, the 3D vertical array is formed using cell structure based on the fourth architecture wherein a memory is formed between the word line and the selector. The memory and the selector are then segmented to form a separate memory segment and a separate selector segment for each word line. For example, the fourth architecture results in a cell structure as shown in FIG. 3H.

Thus, the method 1000 operates to form a novel cell structure that eliminates or reduces sneak leakage path problems for use in a vertical 3D array. It should be noted that the method 1000 is exemplary and that the disclosed operations may be combined, rearranged, added to, deleted, and/or modified within the scope of the embodiments.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A 3D vertical memory array structure formed by performing operations comprising:
    forming an array stack comprising alternating word line layers and insulator layers;
    forming an opening through the array stack;
    identifying a first material and a second material, wherein the first material is identified as either a selector material or a memory material, and the second material is identified as either the selector material or the memory material that is not identified as the first material;
    depositing the first material on internal surfaces of the word line layers and the insulator layers formed by the opening, depositing the second material on the first material, and depositing the conductor material on the second material; and
    forming an open region between the word line layers by removing portions of the insulator layers and the first material to form first material segments, each first material segment has a first surface directly connected to a respective word line layer and a second surface directly connected to the second material.

2. The structure of claim 1, wherein the operation of forming the open region comprises:
    forming the open region between the word line layers by removing portions of the second material to form second material segments, and wherein each second material segment has a first surface directly connected to a respective first material segment and a second surface directly connected to the conductor material.

3. The structure of claim 2, wherein the selector material is identified as the first material and the memory material is identified as the second material.

4. The structure of claim 2, wherein the memory material is identified as the first material and the selector material is identified as the second material.

5. The structure of claim 1, wherein the operation of forming the opening comprises etching the opening through the array stack to form the internal surfaces of the word line layers and the insulator layers.

6. The structure of claim 1, wherein the word line layers comprise at least one of Tantalum (Ta), Niobium (Nb), Titanium (Ti), Zirconium (Zr), and Vanadium-Chromium (VCr).

7. The structure of claim 1, wherein the selector material comprises at least one of P-N diode material, Schottky diode material, and threshold behavior material that uses a threshold to control current flow direction.

8. The structure of claim 1, wherein the memory material comprises one of resistive material or phase-change material.

9. The structure of claim 8, wherein the resistive material comprises at least one of HfOx, LiSiOx, ZrSiOx, WOx, TaOx, NbOx, TiOx, AlOx, NiOx, ZrOx, CuOx, CrOx, MnOx, MoOx, and SiOx material, and the operation of depositing the resistive material comprises performing a thin film deposition of the resistive material.

10. The structure of claim 9, wherein the operation of depositing the resistive material comprises depositing multiple layers of the resistive material, wherein a first layer is formed from HfOx and a second layer is formed from AlOx or PtOx.

11. The structure of claim 8, wherein the operation of depositing the memory material comprises depositing a first layer of the phase-change material and a second layer of heater material.

12. The structure of claim 1, wherein the operation of depositing the conductor material comprises depositing at least one of platinum (Pt), tantalum (Ta), titanium (Ti), aluminum (Al), copper (Cu), tungsten (W), nickel (Ni), chromium (Cr), praseodymium (Pr), ruthenium (Ru), silver (Ag), or polysilicon material into the opening in the memory layer.

13. A method for forming a 3D vertical memory array structure, the method comprising:

forming an array stack comprising alternating word line layers and insulator layers;

forming an opening through the array stack;

identifying a first material and a second material, wherein the first material is identified as either a selector material or a memory material, and the second material is identified as either the selector material or the memory material that is not identified as the first material;

depositing the first material on internal surfaces of the word line layers and the insulator layers formed by the opening, depositing the second material on the first material, and depositing the conductor material on the second material; and forming an open region between the word line layers by removing portions of the insulator layers and the first material to form first material segments, each first material segment has a first surface directly connected to a respective word line layer and a second surface directly connected to the second material.

14. The method of claim 13, wherein the operation of forming the open region comprises:

forming the open region between the word line layers by removing portions of the second material to form second material segments, and wherein each second material segment has a first surface directly connected to a respective first material segment and a second surface directly connected to the conductor material.

15. The method of claim 14, wherein when the selector material is identified as the first material the memory material is identified as the second material, and when the memory material is identified as the first material the selector material is identified as the second material.

16. The method of claim 13, wherein the selector material comprises at least one of P-N diode material, Schottky diode material, and threshold behavior material that uses a threshold to control current flow direction.

* * * * *